United States Patent
Lin et al.

(10) Patent No.: US 10,242,741 B1
(45) Date of Patent: Mar. 26, 2019

(54) LOW VOLTAGE DIFFERENCE OPERATED EEPROM AND OPERATING METHOD THEREOF

(71) Applicant: YIELD MICROELECTRONICS CORP., Chu-Pei (TW)

(72) Inventors: Hsin-Chang Lin, Chu-Pei (TW); Wen-Chien Huang, Chu-Pei (TW); Chia-Hao Tai, Chu-Pei (TW)

(73) Assignee: Yield Microelectronics Corp., Chu-Pei (TW)

( * ) Notice: Subject to any disclaimer, the term of this patent is extended or adjusted under 35 U.S.C. 154(b) by 59 days.

(21) Appl. No.: 15/708,493

(22) Filed: Sep. 19, 2017

(51) Int. Cl.
 *G11C 16/04* (2006.01)
 *H01L 27/11521* (2017.01)
 *G11C 16/14* (2006.01)
 *H01L 29/78* (2006.01)
 *G11C 16/10* (2006.01)
 *H01L 29/788* (2006.01)

(52) U.S. Cl.
 CPC .......... *G11C 16/0433* (2013.01); *G11C 16/10* (2013.01); *G11C 16/14* (2013.01); *H01L 27/11521* (2013.01); *H01L 29/7833* (2013.01); *H01L 29/7881* (2013.01)

(58) Field of Classification Search
 CPC ...... G11C 16/0433; G11C 16/10; G11C 16/14
 USPC .......................... 365/185.29, 185.18, 185.01
 See application file for complete search history.

(56) References Cited

U.S. PATENT DOCUMENTS

| | | | | |
|---|---|---|---|---|
| 6,313,516 B1* | 11/2001 | Tsui | ................... | H01L 27/0629 257/532 |
| 2007/0032032 A1* | 2/2007 | Heineck | ............ | H01L 27/10867 438/386 |
| 2009/0201742 A1* | 8/2009 | Lee | ..................... | G11C 16/0441 365/185.24 |

* cited by examiner

*Primary Examiner* — Connie C Yoha
(74) *Attorney, Agent, or Firm* — Rosenberg, Klein & Lee (57) ABSTRACT

The present invention discloses a low voltage difference-operated EEPROM and an operating method thereof wherein at least one transistor structure is formed in a semiconductor substrate and each includes a first electric-conduction gate. An ion implantation is performed by masking partial regions to prevent the existence of the conventional lightly doped drain (LDD) structure. An undoped region is formed in the semiconductor substrate under the two sides of the first electric-conductive gate, to increase the intensity of electric field between the gate and the substrate or between the gate and the transistor, whereby to reduce the voltage differences required for writing and erasing. The present invention also discloses an operating method for the low voltage difference-operated EEPROM. The present invention applies to the EEPROM with a single gate transistor structure.

12 Claims, 6 Drawing Sheets

LOW VOLTAGE DIFFERENCE OPERATED EEPROM AND OPERATING METHOD THEREOF

BACKGROUND OF THE INVENTION

Field of the Invention

The present invention relates to an EEPROM technology, particularly to a low voltage difference operated EEPROM and operating method thereof wherein the transistor does not have the lightly doped drain (LDD) structure.

Description of the Related Art

Non-volatile memories, such as Flash memories and EEPROM (Electrically Erasable Programmable Read Only Memory), are semiconductor storage devices that can be electrically written and erased repeatedly. Nowadays, non-volatile memories have been widely used in electronic products because their data will not volatilize after the power source is turned off.

A non-volatile memory is programmable via storing charges to vary the gate voltage of the transistors or via not storing charges to keep the original gate voltage. A non-volatile memory is erasable by removing the charges stored there inside to restore the original gate voltage thereof. The current EEPROM is erased with a higher voltage difference, which causes the memory to have a larger area and a more complicated fabrication process.

Figure 1A:
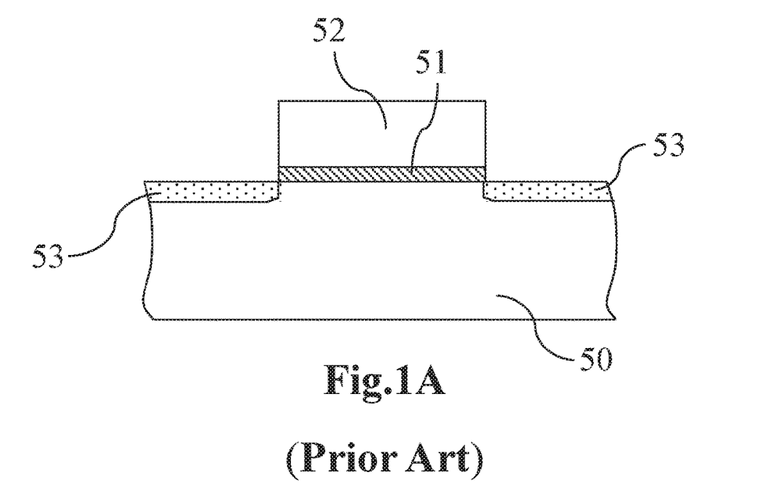
FIGS. 1A and 1B are cross-sectional diagrams showing a conventional method of forming an LDD structure on a metal-oxide semiconductor field-effect transistor (MOSFET)
Figure 1B:
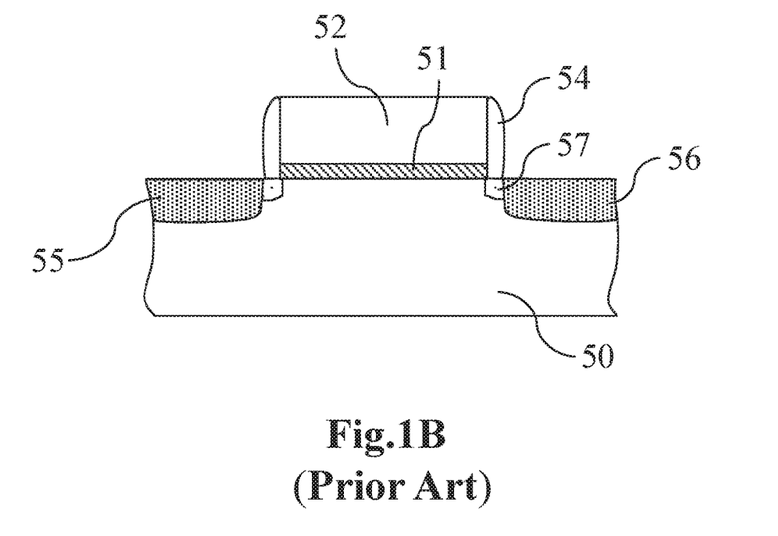

In addition, refer to FIGS. 1A and 1B showing a cross-sectional view of the standard metal-oxide semiconductor field-effect transistor (MOSFET) structure under the sub-micron process. As shown in FIG. 1A, after the gate stacking structure of the gate dielectric layer 51 and the electric-conductive gate electrode 52 are formed on the semiconductor substrate 50, the light ion doping process is performed with the electric-conductive gate electrode 52 as a shield to form a light ion doping region 53. As shown in FIG. 1B, spaces 54 are formed on both sides of the electric-conductive gate electrode 52 and a heavy ion doping process is performed with the spacer 54 and the electric-conductive gate electrode 52 as the shields to form the source electrode 55 and the drain electrode 56 structure; wherein the area without heavily ionized within the light ion doping region 53 is a lightly doped drain (LDD) 57 region.

In order to avoid increasing the complexity of the existing process without affecting the stability of the memory element, the present invention proposes a low voltage difference and low current operated EEPROM and an operating method thereof to overcome the conventional problems.

SUMMARY OF THE INVENTION

The primary objective of the present invention is to provide a low voltage difference operated EEPROM and an operating method thereof wherein an ion implantation is performed by masking partial regions to prevent the existence of the conventional lightly doped drain (LDD) region to increase the intensity of the electric field between the gate and the substrate or between the gate and the transistor and thus decrease the required voltage difference for erasing or writing EEPROM, and wherein the operating method is able to massively erase or write memory cells simultaneously.

Another objective of the present invention is to provide a low voltage difference operated EEPROM and an operating method thereof, which use the voltage difference between the gate and the source/drain or the voltage difference between the gate and the substrate/well to write or erase EEPROM in a lower current.

To achieve the abovementioned objectives, the present invention proposes a low voltage difference operated EEPROM, which comprises a semiconductor substrate, at least one transistor structure and a capacitor structure. The transistor structure and the capacitor structure are formed in the semiconductor substrate, wherein the transistor structure includes a first dielectric layer formed on the surface of the semiconductor substrate; a first electric-conduction gate formed on the first dielectric layer; two undoped regions formed inside the semiconductor substrate under two sides of the first electric-conduction gate; and at least two first ion-doped regions formed inside the semiconductor substrate under the two sides of the first electric-conduction gate and separated from the undoped regions to separately function as the source and the drain. The capacitor structure is separated from the transistor structure, and includes a second ion-doped region formed inside the semiconductor substrate, a second dielectric layer formed on a surface of the second ion-doped region, and a second electric-conduction gate stacked on the second dielectric layer. The second electric-conduction gate is electrically connected with the first electric-conduction gate to function as a single floating gate.

The EEPROM of the present invention is characterized in performing an ion implanting by masking partial regions to prevent the existence of the lightly doped drain (LDD) region of the conventional transistor structure, and forming an undoped region to increase the intensity of the electric field between the gate and the substrate or between the gate and the transistor, whereby to decrease the voltage difference required for writing or erasing the EEPROM.

While the transistor structure of the present invention is an N-type transistor, the first ion-doped region or the second ion-doped region is an N-type doped region, and the semiconductor substrate is a P-type semiconductor substrate or a semiconductor substrate having a P-type well. While the transistor structure of the present invention is a P-type transistor, the first ion-doped region or the second ion-doped region is a P-type doped region, and the semiconductor substrate is an N-type semiconductor substrate or a semiconductor substrate having an N-type well.

In addition, the capacitor structure further comprises a lightly doped drain (LDD) to replace the well structure. The lightly-doped region is formed inside the semiconductor substrate under one side of the second electric-conduction gate and adjacent to the second ion-doped region. While the transistor structure is an N-type transistor, the operating method of the present invention comprises a step: respectively applying a gate voltage $V_g$, a source voltage $V_s$, a drain voltage $V_d$ and a substrate voltage $V_{sub}$ to the first electric-conduction gate (or the floating gate), the source, the drain and the semiconductor substrate, wherein in writing, $V_{sub}$=ground, $V_s$=$V_d$≥0, and $V_g$=HV (High Voltage), or $V_{sub}$=ground, $V_s$=$V_d$=HV, and $V_g$>2V, and wherein in erasing, $V_{sub}$=ground, $V_s$=$V_d$=HV, and $V_g$=0, floating voltage, or <2V.

While the transistor structure is a P-type transistor, the operating method of the present invention comprises a step: respectively applying a gate voltage $V_g$, a source voltage $V_s$, a drain voltage $V_d$ and a substrate voltage $V_{sub}$ to the first electric-conduction gate (or the floating gate), the source, the drain and the semiconductor substrate, wherein in writing, $V_{sub}$=HV, $V_s$=$V_d$≤HV, and $V_g$=0, or $V_{sub}$=HV, $V_s$=$V_d$=0, and $V_g$ is smaller than HV=2V, and wherein in erasing, $V_{sub}$=HV, $V_s$=$V_d$=0, and $V_g$ is floating voltage or smaller than HV=2V.

Below, embodiments are described in detail in cooperation with the attached drawings to make easily understood the objectives, technical contents, and accomplishments of the present invention.

DETAILED DESCRIPTION OF THE INVENTION

The present invention proposes a low voltage difference operated EEPROM (Electrically Erasable Programmable Read Only Memory) and an operating method thereof. The EEPROM of the present invention is characterized in forming the undoped region to prevent the existence of the lightly doped drain (LDD) region of the conventional transistor structure. The intensity of the electric field between the gate and the transistor or between the gate and the substrate is increased, so as to decrease the voltage difference for writing or erasing. The operating method of the present invention simultaneously applies operating voltages to the gate, the source and the drain, which are connected with a memory cell, to massively write or erase memory cells.

Figure 2:
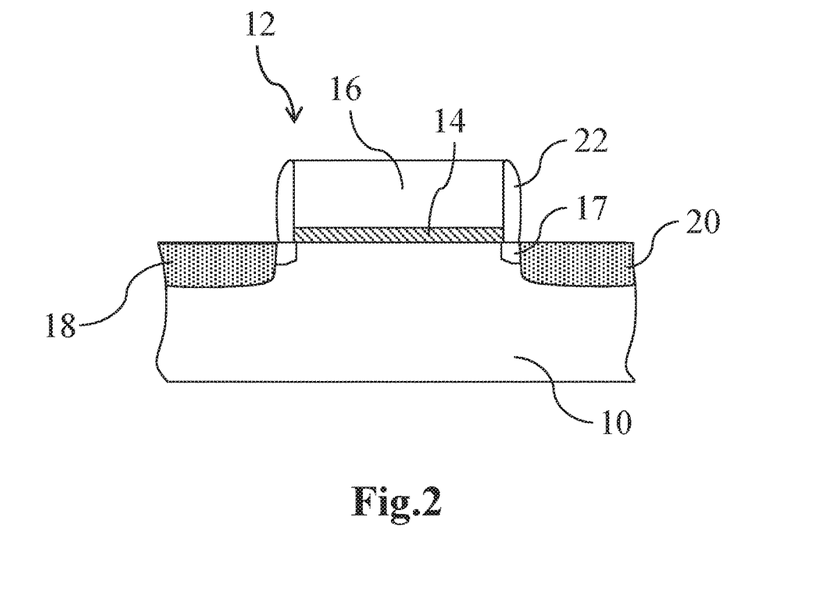
FIG. 2 is a diagram schematically showing a low voltage difference operated EEPROM according to one embodiment of the present invention.

Refer to FIG. 2. The EEPROM of the present invention comprises a semiconductor substrate 10 and at least one transistor structure 12 formed in the semiconductor substrate 10. The transistor structure 12 includes a first dielectric layer 14 formed on the surface of the semiconductor substrate 10; a first electric-conduction gate 16 formed on the first dielectric layer 14; two undoped regions 17 formed inside the semiconductor substrate 10 under two sides of the first electric-conduction gate 16; and at least two first ion-doped regions (18 and 20) formed inside the semiconductor substrate 10 under the two sides of the first electric-conduction gate 16 and separated from the undoped regions 17 to respectively function as a source 18 and a drain 20. The present invention uses the voltage difference between the gate and the source/drain or the voltage difference between the gate and the substrate/well to make electrons pass through the dielectric layer (oxide layer) so as to write or erase EEPROM in a lower current.

Spacers 22 are respectively formed on two side walls of the first dielectric layer 14 and the first electric-conduction gate 16. Before forming of the spacers 22, a light ion doping is performed on the first ion-doped regions by masking the undoped regions 17 with a mask. Then, a heavy ion doping is performed to implant with the same type of ions by using the spacers 22 as a shield to increase an ion concentration of the first ion-doped regions. There does not have any lightly doped drain (LDD) region in the first ion doped regions 18, 20. Therefore, the present invention does not affect the stability of the memory element, while to avoid increasing the complexity of the existing process to achieve the purpose of writing or erasing EEPROM in a low current.

The memory cell of the EEPROM with a single-floating gate structure further comprises a capacitor structure. The second electric-conduction gate of the capacitor is electrically connected with the first electric-conduction gate and functions as a single floating gate. The detail of different structures and the operating methods thereof will be described below.

Figure 3:
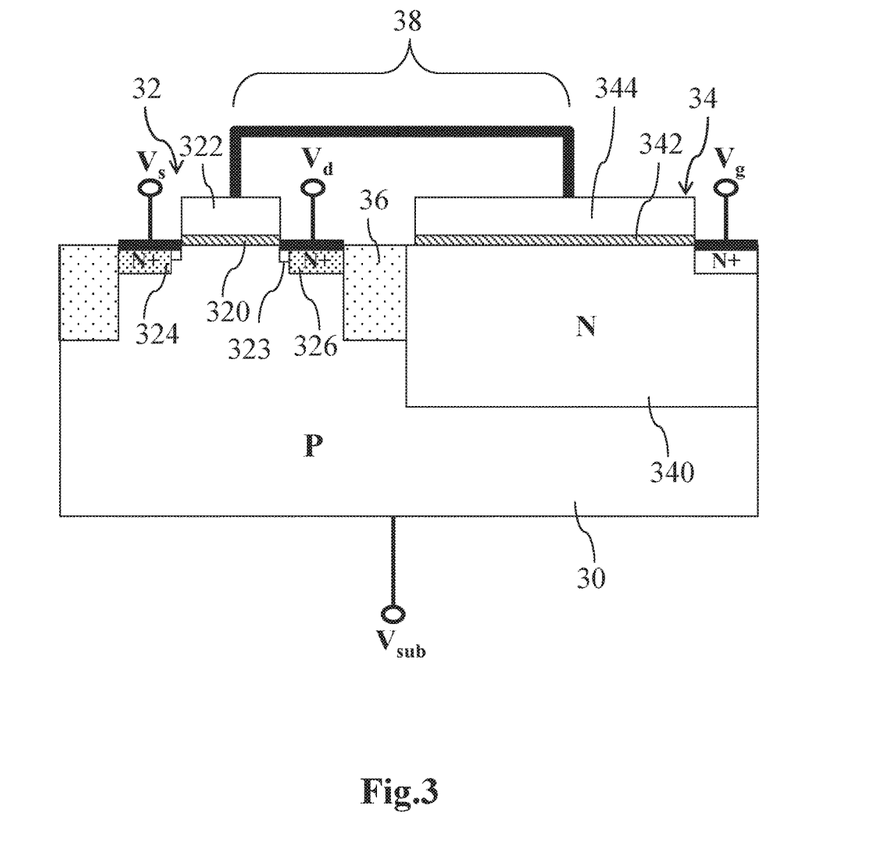
FIG. 3 is a diagram schematically showing a single memory cell with an N-type transistor and a single-floating gate structure according to one embodiment of the present invention.

Refer to FIG. 3 a diagram schematically showing a single memory cell with an N-type transistor and a single-floating gate structure according to one embodiment of the present invention. In the embodiment shown in FIG. 3, a memory cell of the EEPROM of the present invention comprises a P-type semiconductor substrate 30, an N-type transistor 32, such as an N-type MOSFET, formed in the P-type semiconductor substrate 30, and an N-well capacitor 34 formed in the P-type semiconductor substrate 30 and separated from the N-type transistor 32 by a spacer 36. The N-type transistor 32 includes a first dielectric layer 320 formed on the surface of the P-type semiconductor substrate 30; a first electric-conduction gate 322 stacked on the first dielectric layer 320; two undoped regions 323 formed inside the semiconductor substrate 30 under two sides of the first electric-conduction gate 322; and two N-type ion-doped regions formed inside the P-type semiconductor substrate 30 under the two sides of the first electric-conduction gate 322 and separated from the undoped regions 323 to respectively functioning as a source 324 and a drain 326, wherein a channel exists between the source 324 and the drain 326. The N-well capacitor 34 includes a second ion-doped region formed in the P-type semiconductor substrate 30 and functioning as an N-type well 340; a second dielectric layer 342 formed on the surface of the N-type well 340; and a second electric-conduction gate 344 formed on the second dielectric layer 342, whereby a top plate-dielectric layer-bottom plate capacitor structure is formed. The first electric-conduction gate 322 of the N-type transistor 32 and the second electric-conduction gate 344 of the N-well capacitor 34 are electrically connected with each other and separated by the spacer 36 to form the structure of a single floating gate 38.

Figure 4:
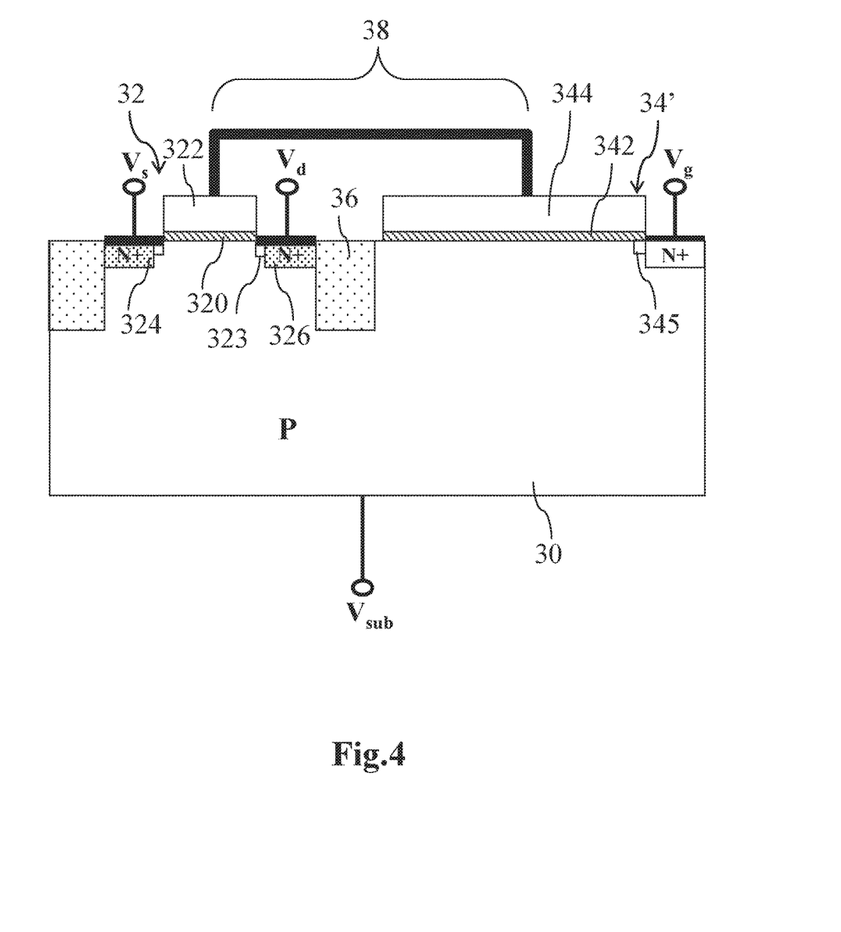
FIG. 4 is a diagram schematically showing a single memory cell with an N-type transistor and a single-floating gate structure according to another embodiment of the present invention.

Refer to FIG. 4, a diagram schematically showing a single memory cell with an N-type transistor and a single-floating gate structure according to another embodiment of the present invention. In this embodiment shown in FIG. 4, a memory cell of the EEPROM of the present invention includes a P-type semiconductor substrate 30. An N-type transistor 32, such as an N-type MOSFET, is formed in the P-type semiconductor substrate 30, and an N-type capacitor 34' formed in the P-type semiconductor substrate and separated from the N-type transistor 32 by a spacer 36. The N-type transistor 32 includes a first dielectric layer 320 formed on the surface of the P-type semiconductor substrate 30, a first electric-conduction gate 322 stacked on the first dielectric layer 320, two undoped regions 323 formed inside the semiconductor substrate 30 under two sides of the first electric-conduction gate 322, and two N-type ion-doped regions formed inside the P-type semiconductor substrate 30 under the two sides of the first electric-conduction gate 322 and separated from the undoped regions 323 to respectively functioning as a source 324 and a drain 326. A channel is formed between the source 324 and the drain 326. The N-type capacitor 34' includes a second ion-doped region formed in the P-type semiconductor substrate 30, a second dielectric layer 342 formed on the surface of the P-type semiconductor substrate 30, and a second electric-conduction gate 344 formed on the second dielectric layer 342, whereby a top plate-dielectric layer-bottom plate capacitor structure is formed. The N-type capacitor 34' further includes a lightly doped drain (LDD) 345 to replace the N-well structure 340 of FIG. 3. The lightly-doped region 345 is formed inside the P-type semiconductor substrate 30 under one side of the second electric-conduction gate 344 and adjacent to the second ion-doped region. The first electric-conduction gate 322 of the N-type transistor 32 and the second electric-conduction gate 344 of the N-type capacitor 34' are electrically connected with each other and separated by the spacer 36 to form the structure of a single floating gate 38.

Refer to FIG. 3 and FIG. 4. Suppose that the memory cell of the EEPROM has the N-type transistor 32 and that the lightly doped drain (LDD) does not exist in the N-type transistor 32, to increase the intensity of electric field between the gate and the substrate or between the gate and the transistor, whereby to decrease the voltage difference required for writing or erasing the EEPROM. No matter whether the memory cell structure shown in FIG. 3 or FIG. 4 is used, the operating method of the present invention comprises a step: respectively applying a gate voltage $V_g$, a source voltage $V_s$, a drain voltage $V_d$ and a substrate voltage $V_{sub}$ to the first electric-conduction gate 322 (or the single floating gate 38), the source 324, the drain 326 and the P-type semiconductor substrate 30, wherein in writing the N-type transistor 32, $V_{sub}$=ground, $V_s=V_d\geq 0$, and $V_g$=HV (High Voltage), or $V_{sub}$=ground, $V_s=V_d$=HV, and $V_g$>2V, and wherein in erasing the N-type transistor 32, $V_{sub}$=ground, $V_s=V_d$=HV, and $V_g$=0, floating voltage, or <2V. In writing a P-type transistor, $V_{sub}$=HV, $V_s=V_d\leq$HV, and $V_g$=0, or $V_{sub}$=HV, $V_s=V_d$=0, and $V_g$ is smaller than HV=2V. In erasing the P-type transistor, $V_{sub}$=HV, $V_s=V_d$=0, and $V_g$ is floating voltage or smaller than HV=2V.

Figure 5:
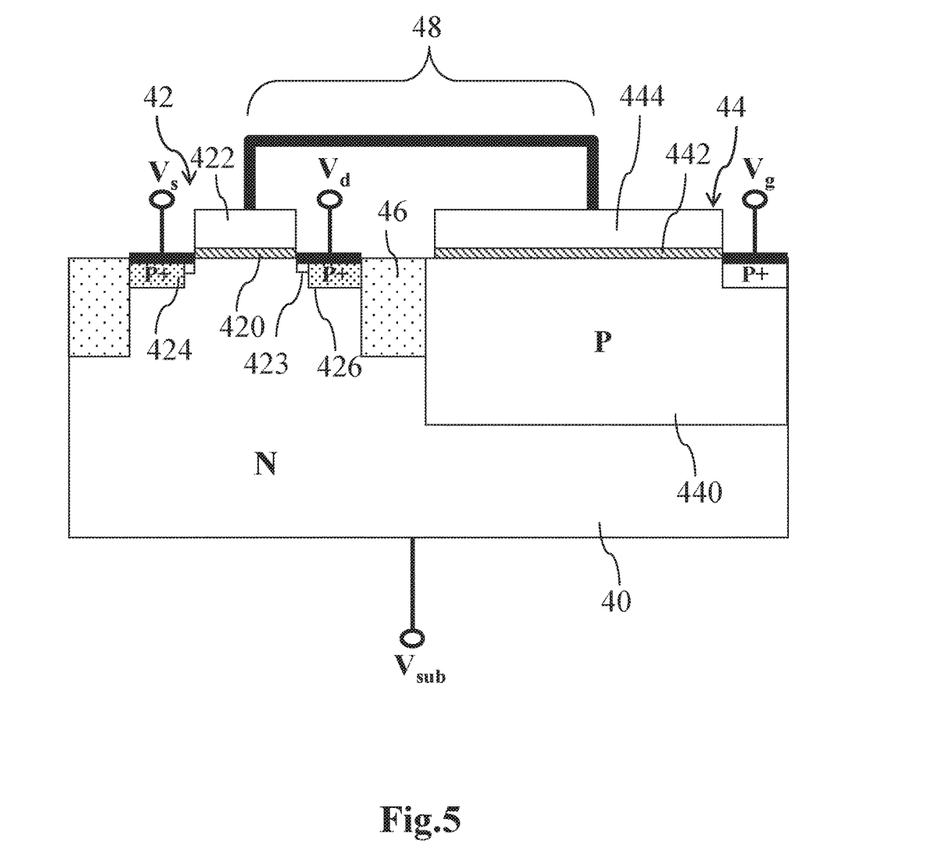
FIG. 5 is a diagram schematically showing a single memory cell with a P-type transistor and a single-floating gate structure according to one embodiment of the present invention.

Refer to FIG. 5 a diagram schematically showing a single memory cell with a P-type transistor and a single-floating gate structure according to one embodiment of the present invention. In the embodiment shown in FIG. 5, a memory cell of the EEPROM of the present invention comprises an N-type semiconductor substrate 40. A P-type transistor 42 and a P-well capacitor 44 are formed in the N-type semiconductor substrate 40 and separated by a spacer 46. The P-type transistor 42, such as a P-type MOSFET, includes a first dielectric layer 420 formed on the surface of the N-type semiconductor substrate 40, a first electric-conduction gate 422 stacked on the first dielectric layer 420, two undoped regions 423 formed inside the semiconductor substrate 40 under two sides of the first electric-conduction gate 422, and two P-type ion-doped regions formed inside the N-type semiconductor substrate 40 under the two sides of the first electric-conduction gate 422 and separated from the undoped regions 423 to respectively functioning as a source 424 and a drain 426, wherein a channel exists between the source 424 and the drain 426. The P-well capacitor 44 includes a second ion-doped region formed inside the N-type semiconductor substrate 40 and functioning as a P-type well 440, a second dielectric layer 442 formed on the surface of the P-type well 440, and a second electric-conduction gate 444 formed on the second dielectric layer 442, whereby to form a top plate-dielectric layer-bottom plate capacitor structure. The first electric-conduction gate 422 of the P-type transistor 42 and the second electric-conduction gate 444 of the P-well capacitor 44 are electrically connected with each other and separated by the spacer 46 to form a single floating gate 48.

Figure 6:
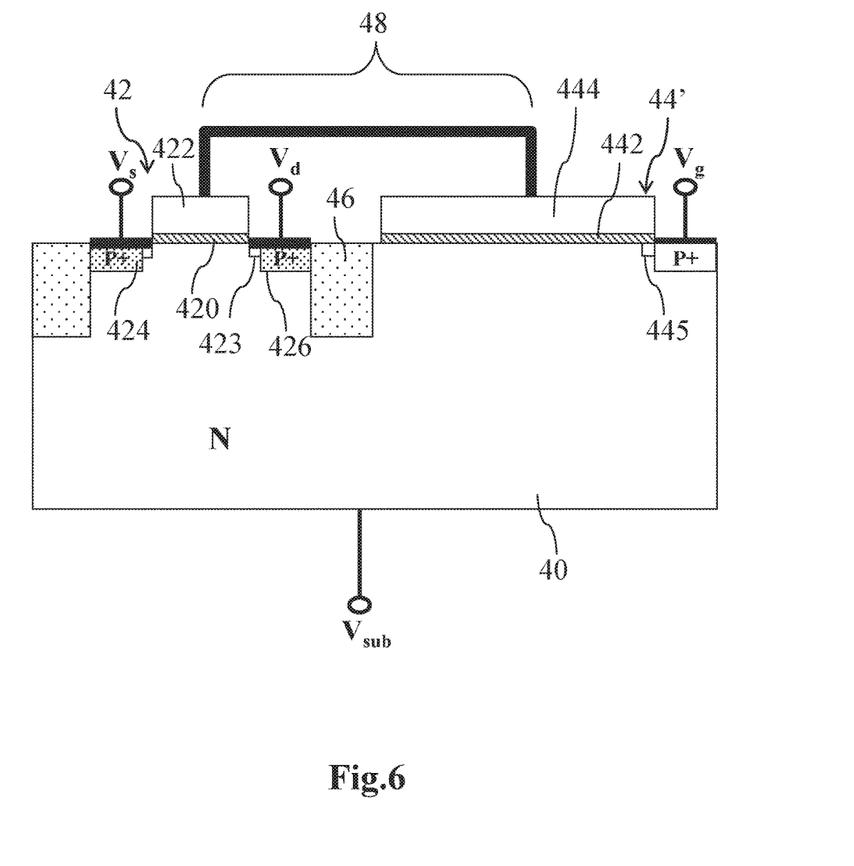
FIG. 6 is a diagram schematically showing a single memory cell with a P-type transistor and a single-floating gate structure according to another embodiment of the present invention.

Refer to FIG. 6, a diagram schematically showing a single memory cell with a P-type transistor and a single-floating gate structure according to another embodiment of the present invention. In the embodiment shown in FIG. 6, a memory cell of the EEPROM of the present invention comprises an N-type semiconductor substrate 40. A P-type transistor 42 and a P-type capacitor 44' are formed in the N-type semiconductor substrate 40 and separated by a spacer 46. The P-type transistor 42, such as a P-type MOSFET, includes a first dielectric layer 420 formed on the surface of the N-type semiconductor substrate 40, a first electric-conduction gate 422 stacked on the first dielectric layer 420, two undoped regions 423 formed inside the semiconductor substrate 40 under two sides of the first electric-conduction gate 422, and two P-type ion-doped regions formed inside the N-type semiconductor substrate 40 under the two sides of the first electric-conduction gate 422 and separated from the undoped regions 423 to respectively functioning as a source 424 and a drain 426. A channel is formed between the source 424 and the drain 426. The P-type capacitor 44' includes a second ion-doped region formed inside the N-type semiconductor substrate 40, a second dielectric layer 442 formed on the surface of the N-type semiconductor substrate 40, and a second electric-conduction gate 444 formed on the second dielectric layer 442, whereby to form a top plate-dielectric layer-bottom plate capacitor structure. The P-type capacitor 44' further includes a lightly doped drain (LDD) 445 to replace the N-well structure 440 of FIG. 5. The lightly-doped region 445 is formed inside the N-type semiconductor substrate 40 under one side of the second electric-conduction gate 444 and adjacent to the second ion-doped region. The first electric-conduction gate 422 of the P-type transistor 42 and the second electric-conduction gate 444 of the P-well capacitor 44 are electrically connected with each other and separated by the spacer 46 to form a single floating gate 48.

Refer to FIG. 5 and FIG. 6. No matter whether the memory cell is that shown in FIG. 5 or FIG. 6, it has a P-type transistor 42, and the lightly doped drain (LDD) does not exist in the N-type transistor 32 to increase the intensity of electric field between the gate and the substrate or between the gate and the transistor, whereby to decrease the voltage difference required for writing or erasing the EEPROM. In such cases, the operating method of the present invention comprises a step: respectively applying a gate voltage $V_g$, a source voltage $V_s$, a drain voltage $V_d$ and a substrate voltage $V_{sub}$ to the first electric-conduction gate 422 (or the single floating gate 48), the source 424, the drain 426 and the semiconductor substrate 40, wherein in writing an N-type transistor, $V_{sub}$=ground, $V_s=V_d\geq 0$, and $V_g$=HV (High Voltage), or $V_{sub}$=ground, $V_s=V_d$=HV, and $V_g$>2V, and wherein in erasing the N-type transistor, $V_{sub}$=ground, $V_s=V_d$=HV, and $V_g$=0, floating voltage, or <2V. In writing the P-type transistor, $V_{sub}$=HV, $V_s=V_d\leq$HV, and $V_g$=0, or $V_{sub}$=HV, $V_s=V_d$=0, and $V_g$ is smaller than HV=2V. In erasing the P-type transistor, $V_{sub}$=HV, $V_s$=$V_d$=0, and $V_g$ is floating voltage or smaller than HV=2V.

The embodiments have been described above to demonstrate the technical thoughts and characteristics of the present invention and enable the persons skilled in the art to understand, make, and use the present invention. However, these embodiments are only to exemplify the present invention but not to limit the scope of the present invention. Any equivalent modification or variation according to the spirit of the present invention is to be also included within the scope of the present invention.

What is claimed is:

1. A low voltage difference-operated electrically erasable programmable read only memory (EEPROM) comprising:
   a semiconductor substrate;
   at least one transistor structure formed in said semiconductor substrate and including a first dielectric layer formed on a surface of said semiconductor substrate, a first electric-conduction gate formed on said first dielectric layer, two undoped regions formed inside said semiconductor substrate under two sides of said first electric-conduction gate, and at least two first ion-doped regions formed inside said semiconductor substrate under said two sides of said first electric-conduction gate and separated from said undoped regions to function as a source and a drain; and
   a capacitor structure formed in said semiconductor substrate and separated from said transistor structure, wherein said capacitor structure includes a second ion-doped region formed inside said semiconductor substrate, a second dielectric layer formed on a surface of said second ion-doped region, and a second electric-conduction gate stacked on said second dielectric layer;
   wherein said second electric-conduction gate is electrically connected with said first electric-conduction gate to function as a single floating gate.

2. The low voltage difference-operated EEPROM according to claim 1, wherein while said transistor structure is an N-type transistor, said first ion-doped regions are N-type ion-doped regions, and said semiconductor substrate is a P-type semiconductor substrate or a semiconductor substrate with a P-type well, and wherein while said transistor structure is a P-type transistor, said first ion-doped regions are P-type ion-doped regions, and said semiconductor substrate is an N-type semiconductor substrate or a semiconductor substrate with an N-type well.

3. The low voltage difference-operated EEPROM according to claim 1, wherein said capacitor structure further comprising a lightly doped drain (LDD), and said lightly-doped region is formed inside said semiconductor substrate under one side of said second electric-conduction gate and adjacent to said second ion-doped region.

4. The low voltage difference-operated EEPROM according to claim 1, wherein two spacers are formed between said first dielectric layer and two side walls of said first electric-conduction gate of said transistor structure respectively, and said undoped regions are located inside said semiconductor substrate under said spacers.

5. The low voltage difference-operated EEPROM according to claim 4, wherein before said spacers are formed, a light ion doping is performed on said first ion-doped regions by masking said undoped regions with a mask, and then a heavy ion doping is performed to implant with the same type of ions by using the spacers as a shield to increase an ion concentration of said first ion-doped regions.

6. The low voltage difference-operated EEPROM according to claim 1, wherein said transistor structure is a metal-oxide-semiconductor field-effect transistor (MOSFET).

7. An operating method for a low voltage difference-operated electrically erasable programmable read only memory (EEPROM), wherein said low voltage difference-operated electrically erasable programmable read only memory comprises a semiconductor substrate, at least one N-type transistor and a capacitor structure, wherein said N-type transistor structure and said capacitor structure formed in said semiconductor substrate, and wherein said N-type transistor structure includes a first electric-conduction gate, two undoped regions and at least two ion-doped regions, said undoped regions formed inside said semiconductor substrate under two sides of said first electric-conduction gate, said first ion-doped regions formed inside said semiconductor substrate under said two sides of said first electric-conduction gate and separated from said undoped regions to function as a source and a drain, and wherein said capacitor structure includes a second ion-doped region, a second dielectric layer and a second electric-conduction gate, wherein said second ion-doped region formed inside said semiconductor substrate, said second dielectric layer formed on a surface of said second ion-doped region, and said second electric-conduction gate stacked on said second dielectric layer, and wherein said second electric-conduction gate is electrically connected with said first electric-conduction gate to function as a single floating gate, and wherein said method comprises a step:
   respectively applying a gate voltage $V_g$, a source voltage $V_s$, a drain voltage $V_d$ and a substrate voltage $V_{sub}$ to said first electric-conduction gate or said single floating gate, said source, said drain and said semiconductor substrate,
   wherein in writing, $V_{sub}$=ground, $V_s$=$V_d$≥0, and $V_g$=HV (High Voltage), or $V_{sub}$=ground, $V_s$=$V_d$=HV, and $V_g$>2V, and
   wherein in erasing, $V_{sub}$=ground, $V_s$=$V_d$=HV, and $V_g$=0, a floating voltage, or <2V.

8. The operating method for a low voltage difference-operated EEPROM according to claim 7, wherein said first ion-doped regions are N-type ion-doped regions, and said semiconductor substrate is a P-type semiconductor substrate or a semiconductor substrate with a P-type well.

9. The operating method for a low voltage difference-operated EEPROM according to claim 7, wherein said capacitor structure further comprising a lightly doped drain (LDD), and said lightly-doped region is formed inside said semiconductor substrate under one side of said second electric-conduction gate and adjacent to said second ion-doped region.

10. An operating method for a low voltage difference-operated electrically erasable programmable read only memory (EEPROM), wherein said low voltage difference-operated electrically erasable programmable read only memory comprises a semiconductor substrate, at least one P-type transistor and a capacitor structure, wherein said P-type transistor structure and said capacitor structure formed in said semiconductor substrate, and wherein said P-type transistor structure includes a first electric-conduction gate, two undoped regions and at least two ion-doped regions, said undoped regions formed inside said semiconductor substrate under two sides of said first electric-conduction gate, said first ion-doped regions formed inside said semiconductor substrate under said two sides of said first electric-conduction gate and separated from said undoped regions to function as a source and a drain, and wherein said capacitor structure includes a second ion-doped region, a second dielectric layer and a second electric-conduction gate, wherein said second ion-doped region formed inside said semiconductor substrate, said second dielectric layer formed on a surface of said second ion-doped region, and said second electric-conduction gate stacked on said second dielectric layer, and wherein said second electric-conduction gate is electrically connected with said first electric-conduction gate to function as a single floating gate, and wherein said method comprises a step:

respectively applying a gate voltage $V_g$, a source voltage $V_s$, a drain voltage $V_d$ and a substrate voltage $V_{sub}$ to said first electric-conduction gate or said single floating gate, said source, said drain and said semiconductor substrate,     wherein in writing, $V_{sub}$=HV (High Voltage), $V_s$=$V_d$≤HV, and $V_g$=0, or $V_{sub}$=HV, $V_s$=$V_d$=0, and $V_g$ is smaller than HV=2V, and     wherein in erasing, $V_{sub}$=HV, $V_s$=$V_d$=0, and $V_g$ is a floating voltage or smaller than HV=2V.

11. The operating method for a low voltage difference-operated EEPROM according to claim 10, wherein said first ion-doped regions are P-type ion-doped regions, and said semiconductor substrate is a N-type semiconductor substrate or a semiconductor substrate with a N-type well.

12. The operating method for a low voltage difference-operated EEPROM according to claim 10, wherein said capacitor structure further comprising a lightly doped drain (LDD), and said lightly-doped region is formed inside said semiconductor substrate under one side of said second electric-conduction gate and adjacent to said second ion-doped region.

* * * * *